United States Patent
Cohen et al.

(10) Patent No.: US 8,254,423 B2
(45) Date of Patent: Aug. 28, 2012

(54) (AL,GA,IN)N DIODE LASER FABRICATED AT REDUCED TEMPERATURE

(75) Inventors: Daniel A. Cohen, Santa Barbara, CA (US); Steven P. DenBaars, Goleta, CA (US); Shuji Nakamura, Santa Barbara, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 12/476,208

(22) Filed: Jun. 1, 2009

(65) Prior Publication Data
US 2010/0142576 A1 Jun. 10, 2010

Related U.S. Application Data

(60) Provisional application No. 61/057,519, filed on May 30, 2008.

(51) Int. Cl.
*H01S 5/00* (2006.01)
(52) U.S. Cl. .................................................. 372/45.01
(58) Field of Classification Search ............... 372/45.01
See application file for complete search history.

(56) References Cited

U.S. PATENT DOCUMENTS

| | | | |
|---|---|---|---|
| 4,081,764 A | 3/1978 | Christmann et al. | |
| 6,133,589 A | 10/2000 | Krames et al. | |
| 6,144,683 A * | 11/2000 | Floyd | 372/50.12 |
| 6,750,475 B1 | 6/2004 | Izumi et al. | |
| 2003/0132449 A1 | 7/2003 | Hosono et al. | |
| 2004/0052282 A1 * | 3/2004 | Nakayama | 372/46 |
| 2005/0077537 A1 | 4/2005 | Seong et al. | |
| 2005/0180713 A1 | 8/2005 | Heideman et al. | |
| 2006/0046460 A1 | 3/2006 | Shu | |
| 2006/0126688 A1 * | 6/2006 | Kneissl | 372/43.01 |
| 2007/0001186 A1 * | 1/2007 | Murai et al. | 257/98 |
| 2007/0096127 A1 | 5/2007 | Pattison et al. | |
| 2007/0125995 A1 | 6/2007 | Weisbuch et al. | |
| 2008/0008220 A1 * | 1/2008 | Ueda et al. | 372/45.011 |

OTHER PUBLICATIONS

Nakahara et al, "Improved External Efficiency InGaN-Based Light-Emitting Diodes with Transparent Conductive Ga-Doped ZnO as p-Electrodes," Jan. 9, 2004, Japanese Journal of Applied Physics, vol. 43, No. 2A, pp. L180-L182.*

Andeen, D. et al., "Lateral epitaxial overgrowth of ZnO in water at 90C," Adv. Funct. Mater. 16, 2006, pp. 799-804.

Bour, D. et al., "Silver-clad nitride semiconductor laser diode," Applied Physics Letters 94, 2009, pp. 041124-1-041124-3.

Fang, A. et al., "Electrically pumped hybrid AlGaInAs-silicon evanescent laser," Optics Express, vol. 14, No. 20, Oct. 2, 2006, 7 pages.

Feezell, D. et al., "AlGaN-cladding-free nonpolar InGaN/GaN laser diodes," Japanese Journal of Applied Physics, vol. 46, No. 13, 2007, pp. L284-L286.

Hwang, J. et al., "A novel transparent ohmic contact of indium tin oxide to n-type GaN," Microelectronic Engineering 77, 2005, pp. 71-75.

(Continued)

*Primary Examiner* — Patrick Stafford
(74) *Attorney, Agent, or Firm* — Gates & Cooper LLP

(57) ABSTRACT

A method of fabricating an (Al,Ga,In)N laser diode, comprising depositing one or more III-N layers upon a growth substrate at a first temperature, depositing an indium containing laser core at a second temperature upon layers deposited at a first temperature, and performing all subsequent fabrication steps under conditions that inhibit degradation of the laser core, wherein the conditions are a substantially lower temperature than the second temperature.

26 Claims, 9 Drawing Sheets

OTHER PUBLICATIONS

Kim, J. et al., "Growth of heteroepitaxial ZnO thin films on GaN-buffered Al2O3 (0001) substrates by low-temperature hydrothermal synthesis at 90C**," Adv. Funct. Mater. 17, 2007, pp. 463-471.

Margalith, T. et al., "Nitride-based lasers: advances in cavity design," Proceedings of SPIE, vol. 3944, 2000, pp. 10-21.

Miyoshi, T. et al., "510-515 nm InGaN-based green laser diodes on c-plane GaN substrate," Applied Physics Express 2, 2009, 062201-1-062201-3.

Murai, A. et al., "Hexagonal pyramid shaped light-emitting diodes based on ZnO and GaN direct wafer bonding," Applied Physics Letters 89, 2006, pp. 171116-1-171116-3.

Nguyen, H. et al., "107-mW low-noise green-light emission by frequency doubling of a reliable 1060-nm DFB semiconductor laser diode," IEEE Photonics Technology Letters, vol. 18, No. 5, Mar. 1, 2006, pp. 682-684.

Sasaoka, C. et al., "Over 1000 mW single mode operation of planar inner stripe blue-violet laser diodes," Phys. Stat. Sol. (a) 203, No. 7, 2006, pp. 1824-1828.

Sink, R. et al., "Cleaved GaN facets by wafer fusion of GaN to InP," Appl. Phys. Lett. 68 (15), Apr. 8, 1996, pp. 2147-2149.

Skierbiszewski, C. et al., "High power continuous wave blue InAlGaN laser diodes made by plasma assisted MBE," Acta Physica Polonica A, vol. 110, No. 3, 2006, pp. 345-351.

Okuyama, H., "Review of II-VI green laser diodes," IEICE Trans. Electron., vol. E83-C, No. 4, Apr. 2000, pp. 536-545.

Yao, Y. et al., "Improvement in performance of GaN-based light-emitting diodes with indium tin oxide based transparent ohmic contacts," Displays 28, 2007, pp. 129-132.

Nakahara et al., Improved External Efficiency InGaN-Based Light-Emitting Diodes with Transparent Conductive Ga-Doped ZnO as p-Electrodes; Japanese Journal of Applied Physics, vol. 43, No. 2A 2004, pp. L180-L182.

International Search Report for International Application No. PCT/US2009/045868, International filing date Jun. 1, 2009.

Cheng, B. et al., "Nitride laser diodes with nonepitaxial cladding layers," IEEE Photonics Technology Letters, vol. 22, No. 5, Mar. 1, 2010, 329.

Chinese Office Action dated Apr. 5, 2012, Appln. No. 200980128483.0, with translation.

* cited by examiner

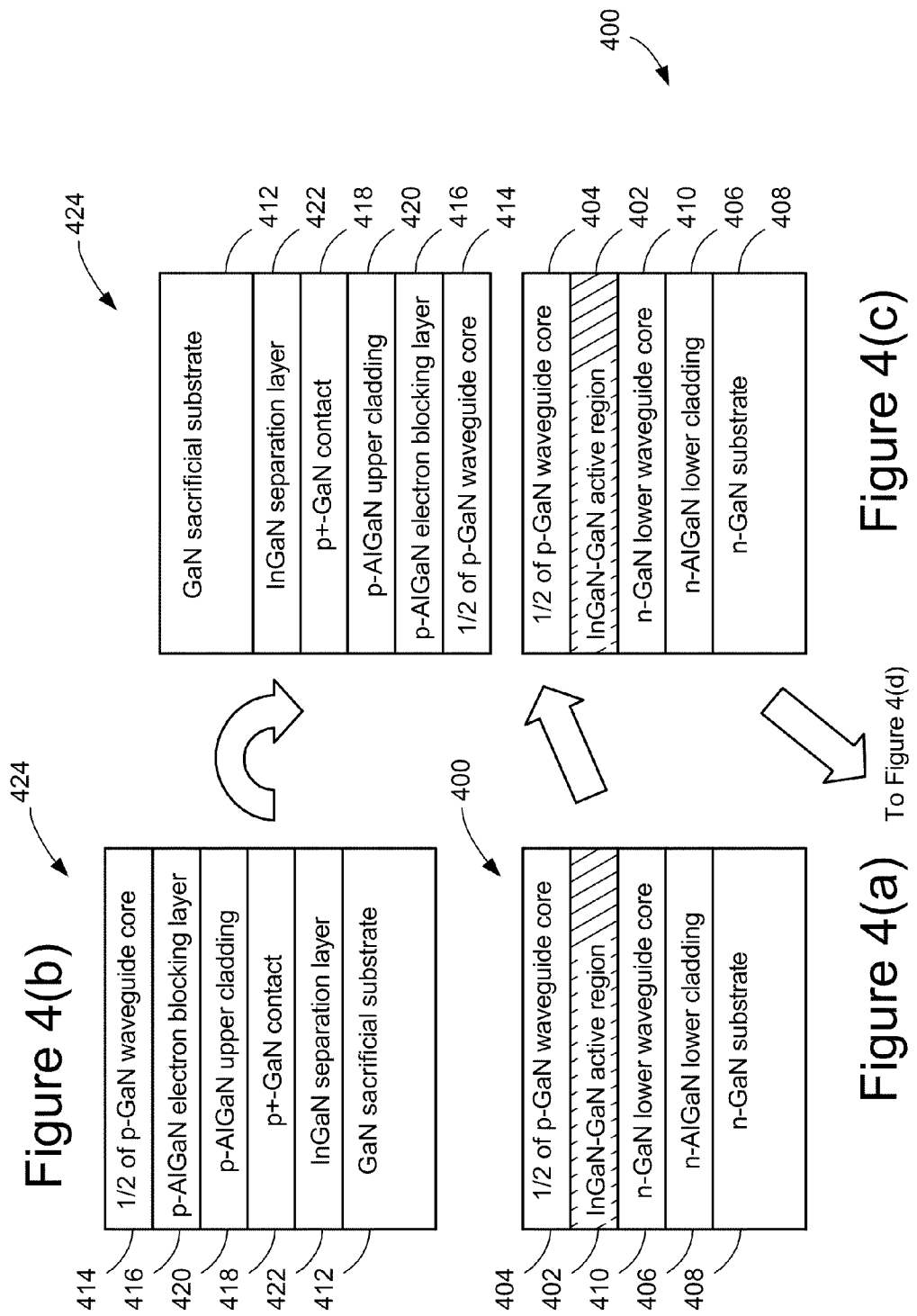

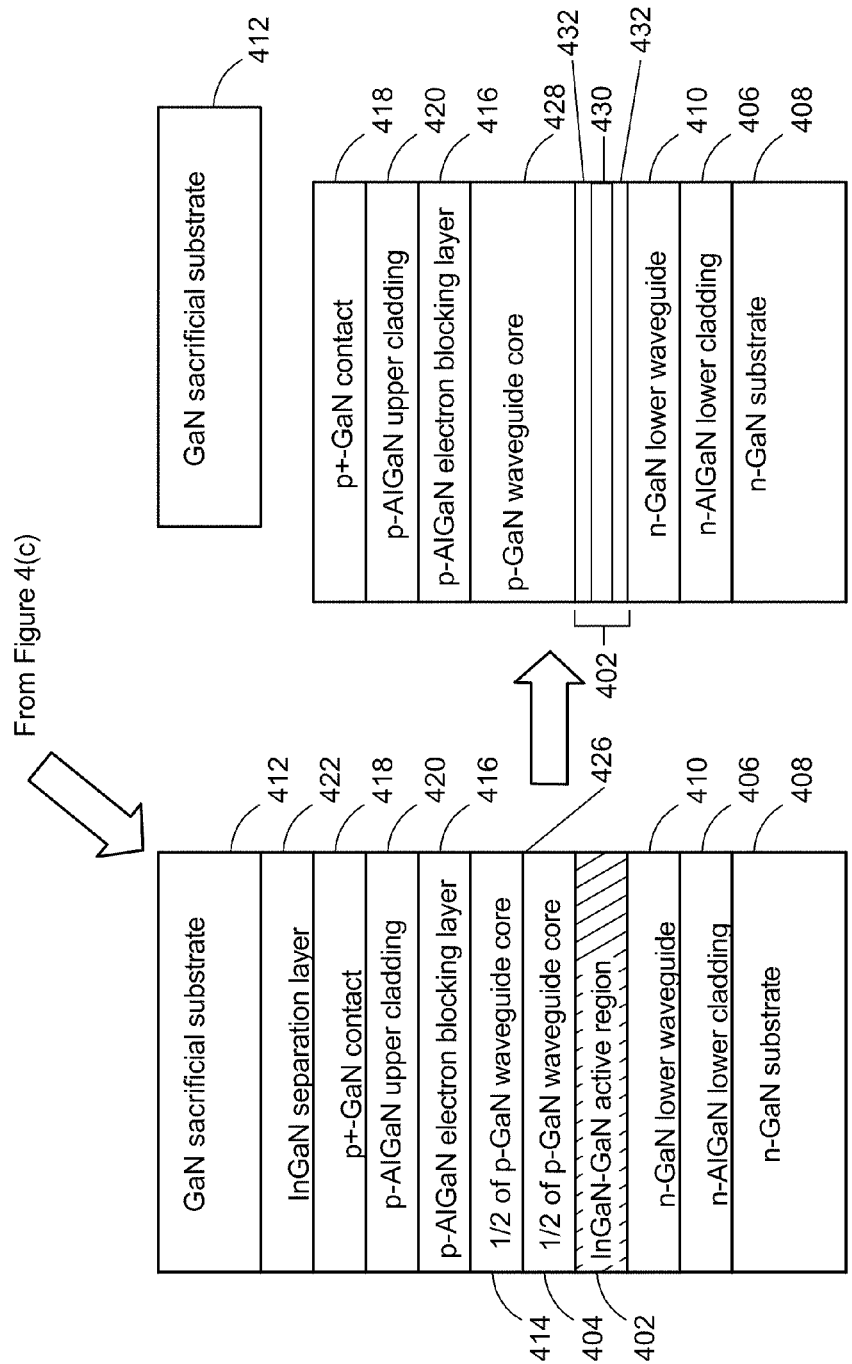

(AL,GA,IN)N DIODE LASER FABRICATED AT REDUCED TEMPERATURE

CROSS REFERENCE TO RELATED APPLICATIONS

This application claims the benefit under 35 U.S.C. Section 119(e) of commonly-assigned U.S. Provisional Patent Application Ser. No. 61/057,519, filed on May 30, 2008, by Daniel A. Cohen, Steven P. Denbaars and Shuji Nakamura, entitled "(Al,Ga,In)N DIODE LASER FABRICATED AT REDUCED TEMPERATURE," which application is incorporated by reference herein.

This application is related to the following co-pending and commonly-assigned U.S. patent applications:

U.S. patent application Ser. No. 11/454,691, filed Jun. 16, 2006, by Akihiko Murai, Christina Ye Chen, Daniel B. Thompson, Lee S. McCarthy, Steven P. DenBaars, Shuji Nakamura, and Umesh K. Mishra, entitled "(Al,Ga,In)N AND ZnO DIRECT WAFER BONDING STRUCTURE FOR OPTOELECTRONIC APPLICATIONS AND ITS FABRICATION METHOD," which application claims the benefit under 35 U.S.C. Section 119(e) of:

U.S. Provisional Application Ser. No. 60/691,710, filed on Jun. 17, 2005, by Akihiko Murai, Christina Ye Chen, Lee S. McCarthy, Steven P. DenBaars, Shuji Nakamura, and Umesh K. Mishra, entitled "(Al,Ga,In)N AND ZnO DIRECT WAFER BONDING STRUCTURE FOR OPTOELECTRONIC APPLICATIONS AND ITS FABRICATION METHOD,"

U.S. Provisional Application Ser. No. 60/732,319, filed on Nov. 1, 2005, by Akihiko Murai, Christina Ye Chen, Daniel B. Thompson, Lee McCarthy, Steven P. DenBaars, Shuji Nakamura, and Umesh K. Mishra, entitled "(Al,Ga,In)N AND ZnO DIRECT WAFER BONDED STRUCTURE FOR OPTOELECTRONIC APPLICATIONS, AND ITS FABRICATION METHOD," and U.S. Provisional Application Ser. No. 60/764,881, filed on Feb. 3, 2006, by Akihiko Murai, Christina Ye Chen, Daniel B. Thompson, Lee S. McCarthy, Steven P. DenBaars, Shuji Nakamura, and Umesh K. Mishra, entitled "(Al,Ga,In)N AND ZnO DIRECT WAFER BONDED STRUCTURE FOR OPTOELECTRONIC APPLICATIONS AND ITS FABRICATION METHOD,"

all of which applications are incorporated by reference herein.

BACKGROUND OF THE INVENTION

1. Field of the Invention

This invention relates to diode lasers and methods of fabrication of diode lasers.

2. Description of the Related Art (Note: This application references a number of different publications as indicated throughout the specification by one or more reference numbers within brackets, e.g., [x]. A list of these different publications ordered according to these reference numbers can be found below in the section entitled "References." Each of these publications is incorporated by reference herein.)

The present invention pertains to diode lasers that operate at wavelengths between 470 and 630 nm—a spectral range poorly served by any diode laser technology. Such lasers would find wide use in scientific, biomedical, sensing, illumination and display applications, supplanting older technologies in existing markets and enabling new markets dependent on the unique advantages of diode lasers. These advantages include small size, low cost, high efficiency, and the capability for high-speed modulation.

Of particular interest is the green spectral range, approximately 495-570 nanometers (nm). When combined with commercially available blue and red diode lasers, a green-emitting diode laser would enable high quality full color projection displays for a very large commercial market.

While green-emitting diode lasers based on the II-VI material system have been demonstrated, their operating lifetime was so short that they could not achieve commercial viability, and development of such II-VI lasers has largely been abandoned [5]. Argon ion gas lasers operating at 488 nm and 514 nm are widely used for several of the applications listed above, but are far too large and inefficient for use in mass markets.

Frequency-doubled solid state lasers emitting at 532 nm, pumped by flashlamps or near infrared diode lasers, are also in widespread use for scientific and material processing applications. The smallest versions of these frequency-doubled diode pumped solid state lasers do manifest many of the advantages of diode lasers: they are small, lightweight, and are capable of high frequency modulation. Yet compared to diode lasers directly emitting the desired wavelength, the frequency-doubled Diode Pumped Solid State (DPSS) lasers are inefficient, low-powered, and costly to manufacture. For example, state-of-the-art miniature frequency-doubled DPSS lasers [6] attain 61% coupling efficiency between the pump laser and the doubling crystal, and 58% efficiency in the doubling crystal. Combined with the 47% electrical-to-optical efficiency of the pump laser, the overall wall plug efficiency of the doubled DPSS module is only 17%, one third that of the original pump laser. In addition, the lenses, and doubling crystal, and the careful alignment needed during manufacture add significant cost to the frequency doubled DPSS laser, costs not incurred by a direct emitting diode laser.

Diode lasers based on the (Al,Ga,In)As material system have been commercialized, with direct emission wavelengths from approximately 1000 nm down to 630 nm. Light emitting diodes based on (Al,Ga,In)P have been commercialized at wavelengths down to the orange range, 570-590 nm, but laser operation has not been achieved in that material system at that wavelength range. Diode lasers based on the (Al,Ga,In)N material system have been commercialized with direct emitting wavelengths from 370 nm up to 470 nm, and record operation up to 510 nm [7], and while green LEDs have been made in (Al,Ga,In)N, laser operation in the green spectral range remains elusive. To obtain green emission, the indium mole fraction of the active region must be increased to approximately 25%, compared to 10-15% used in violet emitting lasers and 20% in true blue lasers. It is widely believed that the limitation in the (Al,Ga,In)N system is that the active region material quality degrades during subsequent crystal growth of the upper waveguide and electrical contact layers used in conventional diode lasers, and that this degradation worsens as the indium content, temperature, and growth time increase.

One solution is to develop low-temperature crystal growth techniques such as plasma-assisted molecular beam epitaxy (PAMBE) or ammonia molecular beam epitaxy ($NH_3$-MBE), which can use growth temperatures significantly lower than those used in the more common growth technique, metalorganic chemical vapor deposition (MOCVD). Indeed, violet-emitting (Al,Ga,In)N diode lasers grown entirely by PAMBE have been demonstrated [8]. It is not yet established that molecular beam epitaxy (MBE) growth will be able to produce green-emitting lasers, for the low growth pressure compared to MOCVD does not favor high indium incorporation or high crystal quality.

Other solutions include a number of different techniques as described below:

Kim [9] has grown single crystal epitaxial zinc oxide (ZnO) layers on (Al,Ga,In)N LEDs using a low temperature hydrothermal method, for the purpose of improved light extraction from LEDs. ZnO lateral epitaxial overgrowth (LEO) onto (Al,Ga,In)N Light Emitting Diodes (LEDs) was also described [10]. The ZnO formed a transparent electrical contact, with no waveguiding function, and use with diode lasers was not discussed.

Sasaoka [1] has described a method to form (Al,Ga,In)N ridge waveguides by high temperature LEO of (Al,Ga,In)N layers through an opening in an AlN mask, for the purpose of improving the performance of lasers emitting violet or blue light. The regrown waveguides performed both electrical and optical functions, but were grown at temperatures that would degrade (Al,Ga,In)N active regions intended for green emission.

Fang [2] has described a technique to bond semiconductor active regions formed from (Al,Ga,In)As and (Al,Ga,In)(As,P), grown on GaAs or InP substrates respectively, to ridge waveguides formed in silicon-on-insulator substrates, specifically for integration of III-V optoelectronic components with silicon electronics. The silicon ridge waveguides were electrically passive, unlike the conducting waveguides proposed in this application. They have demonstrated working electrically-pumped lasers, photodetectors, and amplifiers operating at near infrared wavelengths. They did not claim any applicability to other material systems.

Sink [3] has described a technique to bond (Al,Ga,In)N laser structures to cubic substrates such as GaAs or InP, with subsequent removal of the growth substrate, specifically to facilitate the cleaving of high quality laser facets. The cleavage substrate performed no optical role.

Murai [4] has described a technique to bond bulk ZnO to (Al,Ga,In)N LED structures for the purpose of enhanced light extraction from LEDs. The bonded ZnO performed both an electrical and optical role (See also, U.S. patent application Ser. No. 11/454,691, filed on Jun. 16, 2006, by Akihiko Murai et. al, entitled "(Al,Ga,In)N AND ZnO DIRECT WAFER BONDING STRUCTURE FOR OPTOELECTRONIC APPLICATIONS AND ITS FABRICATION METHOD," which application is incorporated by reference herein.)

Margalith [15] has described transparent electrical contacts to (Al,Ga,In)N, formed by sputter deposition of indium tin oxide (ITO) or titanium nitride, for the purpose of enhanced light extraction from LEDs and for low loss electrical contacts to vertical cavity surface emitting lasers. Surface emitting laser operation was not achieved, and no waveguiding function or other use with in-plane lasers was proposed.

The key invention described here is to use unconventional designs and fabrication methods to eliminate the prolonged growth at high temperature after the laser active region is formed, while retaining the benefits of MOCVD growth of the active region

SUMMARY OF THE INVENTION

Throughout this disclosure, the present invention refers to the use of Group III-Nitride materials, which may be referred to as III-N, III-Nitride, AlGaInN, or (Al,Ga,In)N, with slightly different connotations. It is noted, for example, that AlGaInN encompasses the binary and ternary alloys GaN, AlGaN, and InGaN as well.

Throughout this disclosure, the present invention refers to a III-N active region and to a III-N laser core. It is common in the art to use the term active region to refer to the layers in which light is generated, commonly one or more quantum wells. In this disclosure, the term laser core refers to that part of the laser in which light is generated and largely confined, and comprises the active region layers, the III-N layers surrounding the active layers that serve to confine carriers, commonly called barrier layers, the III-N layers surrounding the outermost barrier layers that serve to inject carriers into the barrier and active region layers and may also serve as waveguide core layers, and III-N layers that serve to further confine carriers to the active region, commonly referred to as electron blocking layers or hole blocking layers.

To overcome the limitations in the prior art described above, and to overcome other limitations that will become apparent upon reading and understanding the present specification, the present invention discloses an (Al,Ga,In)N based diode laser comprising an (Al,Ga,In)N laser core for generating and confining light having a laser wavelength; and at least one transparent and electrically conducting layer deposited on the laser core to provide electrical contact to the laser core, wherein the transparent and electrically conducting layer (i) has a refractive index lower than a refractive index of the laser core, (ii) is deposited by a method other than crystal growth at a temperature above 550° C., (iii) has a bulk resistivity below 10 Ohm-centimeters (Ohm-cm) and is capable of making an electrical contact to the laser core with a specific contact resistance below 0.01 Ohm-cm$^2$, and (iv) has an optical absorption coefficient below 2000 cm$^{-1}$ measured at the laser wavelength.

The transparent and electrically conducting layer typically has a conductivity sufficiently high to provide ohmic electrical contact to the active layer, so that electrons or holes in the transparent and electrically conducting layer may be driven by an external voltage into the active region where they recombine with carriers of the opposite charge and injected from the opposite side of the active region, to generate light.

The transparent and electrically conducting layer may be transparent to the light generated in the laser core, and may serve as a waveguide cladding layer that confines the light generated in the laser core. The transparent and electrically conducting layer may be amorphous or crystalline, for example. Materials for the transparent and electrically conducting layer comprise materials different from a III-Nitride material, such as tin-doped indium oxide (ITO), ZnO, indium oxide, tin oxide, gallium oxide, magnesium oxide, cadmium oxide, other metal oxides, alloys of these compounds, as well as III-N materials.

The transparent and electrically conducting layer may be patterned in a plane of the transparent and electrically conducting layer to form a rib or ridge, to serve as a lateral waveguide core. A wafer bond may be between the transparent and electrically conducting layer and the laser core.

The lower injection layer of the laser core (and therefore the laser core) may be deposited on a transparent layer of lower refractive index, such that the transparent layer of lower refractive index serves as a transverse optical waveguide cladding layer. The transparent and electrically conducting layer, serving as an upper cladding layer that improves confinement of light to the laser core, can be a growth on the III-N upper injection layer of the laser core. The laser core may be on a lower cladding layer, and the effective refractive index of the laser core is typically higher than that of the lower cladding layer, and higher than that of the upper cladding layer, so that the laser core functions as a transverse optical waveguide core. The laser core may also be patterned in a plane of the laser core to form a rib or ridge, to serve as a lateral waveguide core.

In one example, the active region is at least one indium-containing III-Nitride layer that is grown on a III-Nitride lower injection layer, wherein the III-nitride lower injection layer serves to inject either electrons or holes into the active region; multiple active region layers may be employed, separated by III-N layers (e.g. adjacent to each side of the active layer) serving to confine the electrons and holes in the active layers in which light is generated; at least one III-Nitride upper injection layer is grown on the active region, serving as an upper injection layer for carriers of a type not provided by the lower injection layer; embedded in the upper injection layer may be a III-N blocking layer to limit escape of carriers from the active region; and a transparent and electrically conducting layer on the upper injection layer provides electrical contact to the upper injection layer and serves as an upper waveguide cladding layer. In this disclosure, the structure between the lower cladding layer and the upper cladding layer is referred to as the laser core.

A further example comprises at least one first III-Nitride blocking layer between the active region and the lower injection layer and/or at least one second III-Nitride blocking layer between the active region and the upper injection layer, wherein (i) the first III-Nitride blocking layer serves to prevent injection of first minority carriers into the lower injection layer and the first minority carriers are carriers of the type not provided by the lower injection layer, and (ii) the second III-Nitride blocking layer serves to prevent injection of second minority carriers into the upper injection layer and the second minority carriers are carriers of a type not provided by the upper injection layer.

The present invention further discloses a method of fabricating an (Al,Ga,In)N based diode laser comprising depositing at least one transparent and electrically conducting layer on a laser core of the diode laser, wherein a refractive index of the transparent and electrically conducting layer is lower than an effective refractive index of the laser core, and the transparent and electrically conducting layer provides electrical contact to the laser core.

The method may further comprise depositing (by e.g., MOCVD) an indium containing (Al,Ga,In)N laser core.

The transparent and electrically conducting layer may comprise a crystalline transparent conductive oxide layer grown from an aqueous solution, a combination of a crystalline transparent conductive oxide layer grown from an aqueous solution and an amorphous or polycrystalline transparent conducting oxide layer deposited by physical vapor deposition, an amorphous or polycrystalline transparent conducting oxide formed by physical vapor deposition, a crystalline transparent conductive oxide layer wafer bonded to the laser core, or crystalline (Al,Ga,In)N layers grown on a sacrificial substrate and wafer bonded to the laser core.

BRIEF DESCRIPTION OF THE DRAWINGS

Referring now to the drawings in which like reference numbers represent corresponding parts throughout:

FIG. 3($b$) is a schematic representation of an indium tin oxide clad InGaN/GaN MQW laser, wherein replacement of the conventional p-AlGaN upper cladding with e-beam evaporated ITO reduces MQW degradation during growth of subsequent layers, and improves mode overlap with the active region.

FIGS. 4($a$)-4($e$) are schematic representations of a wafer bonding approach, wherein buffer layers are not shown, after wafer bonding the sacrificial substrate is removed, and a ridge waveguide is formed, followed by anode and cathode contact deposition.

DETAILED DESCRIPTION OF THE INVENTION

Figure 1:
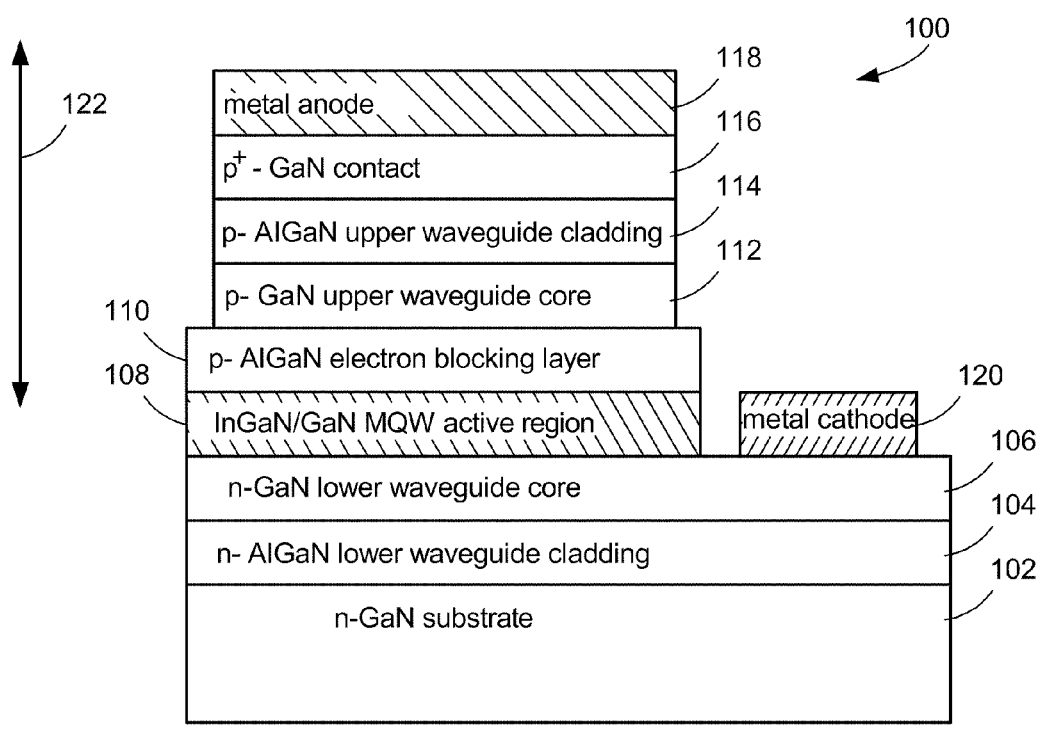
FIG. 1 is a schematic representation of a conventional (Al,Ga,In)N ridge waveguide laser, wherein layers are not drawn to scale, and buffer layers and ridge dielectric isolation are not shown.

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Overview

A tremendous market exists for diode lasers that operate in the green range, 495-570 nm, but this range has only been achieved with short-lived diode lasers fabricated in the II-VI material system or by frequency-doubling solid state lasers optically pumped by (Al,Ga,In)As-based diode lasers operating in the near infrared range. Neither of these previously demonstrated methods provide adequate power or efficiency for important biomedical, sensing, illumination and display applications. While light emitting diodes (LEDs) that emit at wavelengths spanning the 250-560 nm spectral range have been fabricated from the (Al,Ga,In)N material system, diode lasers fabricated from this material system have been limited to operation below 510 nm. It is widely believed that the limitation is due to degradation of the laser core during the prolonged high temperature crystal growth needed to complete the optical waveguide and electrical contact layers grown after the laser core.

The key invention described here is the reduction or elimination of the high temperature process steps after laser core growth, to allow optimization of the laser core for longer wavelength operation. Three related approaches are described that replace the traditional epitaxially-grown (Al,Ga,In)N upper waveguide and electrical contact layers with layers formed by lower temperature processes. One approach uses a crystalline transparent conducting oxide such as ZnO, grown directly on the laser wafer or grown separately and transferred to the laser wafer in a moderate-temperature bonding step. Another approach uses crystalline (Al,Ga,In)N layers grown on a separate substrate and then transferred to the laser wafer with a bonding and substrate removal technique. A third approach uses amorphous or polycrystalline transparent conducting oxides deposited directly onto the laser wafer with low temperature processes. In all cases, the time and temperature to which the laser core is exposed is significantly reduced, thereby reducing degradation of the laser core.

Two additional advantages are expected in the embodiments based on transparent conducting oxides. The high index contrast between (Al,Ga,In)N alloys and transparent conducting oxides and the potential reduction of the p-type GaN needed compared to conventional laser designs, affords significant enhancement of the optical confinement in the laser core and reduction of optical loss. Also, the high electrical conductivity of transparent conducting oxides and the reduced cladding thickness needed compared to conventional designs allows reduction of the operating voltage.

Technical Description

A conventional (Al,Ga,In)N diode laser 100 is shown schematically in FIG. 1. The device comprises a substrate 102, typically GaN, n-type GaN (n-GaN), or sapphire, followed by a GaN buffer layer (not shown), an n-type (Al,Ga)N cladding layer 104 such as an n-type AlGaN (n-AlGaN) lower waveguide cladding layer, and an n-type GaN lower waveguide layer or core 106. An (Al,Ga,In)N active region 108 follows, which is typically a single quantum well or multiple quantum wells (MQW) with multiple barriers (e.g., InGaN/GaN MQW). The active region 108 is followed by an (Al,Ga)N electron blocking layer 110 such as a p-type AlGaN (p-AlGaN) electron blocking layer, a p-type GaN (p-GaN) waveguide layer 112 (e.g. p-GaN upper waveguide core), a p-type (Al,Ga)N upper waveguide cladding layer (e.g., p-AlGaN) 114, a thin $p^+$-type contact layer such as $p^+$-type GaN ($p^+$-GaN) 116, and metal contact layers (metal anode 118 and metal cathode 120). The n-type layers 104, 106 below the active region are typically grown at temperatures above 1100 degrees Celsius (° C.), whereas the active region 108 is typically grown between 850-950° C., and the layers 110, 112, 114 and 116 above the active region 108 are grown at 1000-1100° C.

The layers 110, 112, 114 and 116 above the active region 108 must have a combined thickness 122 sufficient to prevent the optical field that propagates in the waveguide layers 112, 114 from penetrating to the metal contact 118, for this would lead to unacceptably high optical absorption loss. For this reason, these upper layers 110, 112, 114 and 116 typically have a thickness 122 in a range of 0.75-1.5 micrometers.

It is during the high temperature growth of these upper waveguide 112, cladding 114 and contact layers 116 that the (Al,Ga,In)N active region 108 is thought to degrade. The key innovation of this invention is to replace all or part of these layers 112, 114 and 116 grown at high temperature after the active region 108 growth with layers that perform equivalent functions but that are formed without exposing the active region 108 to conditions that promote degradation. Three related approaches are described, each with possible variations.

In one approach, the upper cladding 114 and contact layers 116 are replaced by a crystalline transparent conductor, such as ZnO, deposited on the laser wafer by a low temperature process, such as growth from an aqueous solution. In another approach, transparent conducting layers of (Al,Ga,In)N alloys are grown at high temperature on a separate substrate, and then transferred to the laser wafer by low or moderate temperature bonding and substrate removal steps to complete the waveguide and electrical contact layers. In a third approach, the upper cladding and contact layers are formed from an amorphous or polycrystalline transparent conductor, such as ITO, deposited at low substrate temperature by evaporation or sputtering, possibly followed by a moderate temperature annealing step. In all three approaches, the active region is grown under optimum conditions, and not later exposed to environments that lead to degradation.

Figure 2:
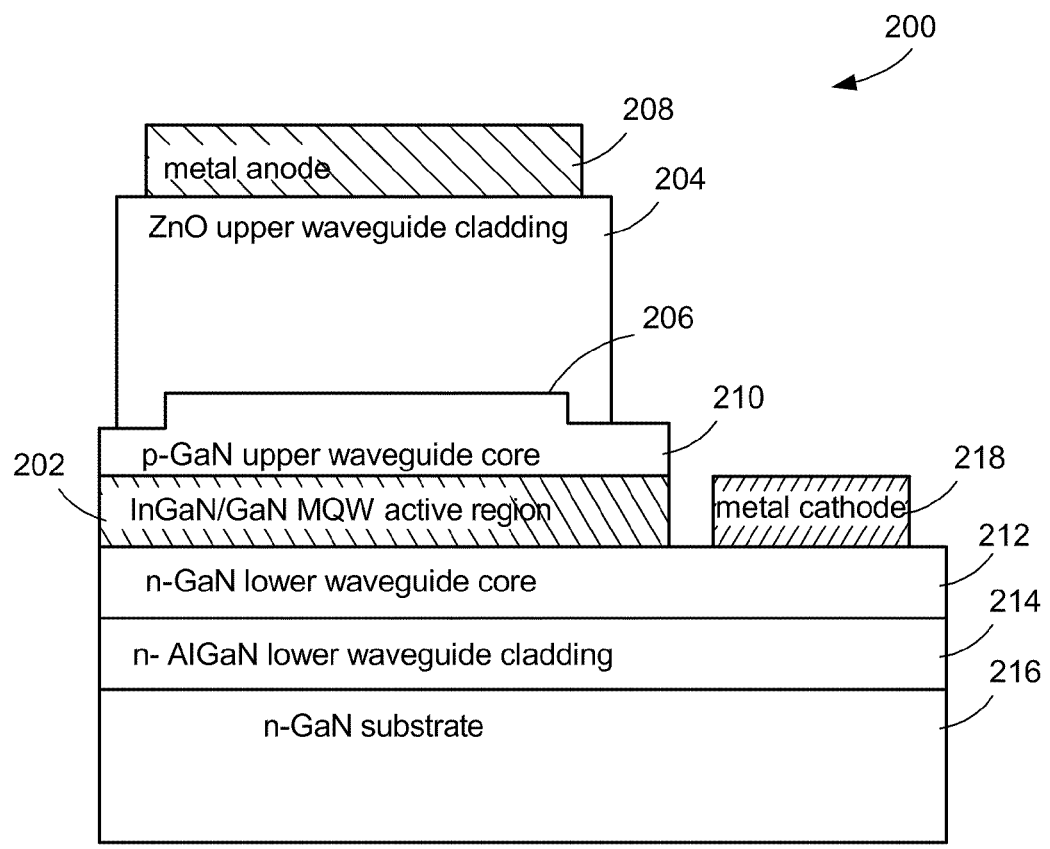
FIG. 2 is a schematic representation of a ridge waveguide laser using crystalline ZnO as the upper cladding and contact layer, wherein layers are not drawn to scale and buffer layers and ridge dielectric isolation are not shown.

FIG. 2 is a cross-sectional schematic of an (Al,Ga,In)N based diode laser 200 comprising an (Al,Ga,In)N laser core (comprising an active region 202) for generating and confining light having a laser wavelength; and at least one transparent and electrically conducting layer 204 (different from a III-Nitride) adjacent (or deposited, or overlaid on) the laser core to provide electrical contact to the laser core, wherein the transparent and electrically conducting layer 204 has a refractive index lower than an effective refractive index of the laser core. FIG. 2 is the preferred implementation of the first approach, in which the AlGaN upper cladding 114 and p-contact layers 116 are replaced by a layer of crystalline ZnO 204 (e.g., ZnO upper waveguide cladding layer), the p-GaN upper waveguide core is patterned to form a ridge 206 waveguide to serve as a lateral waveguide core, isolated with a lower-index dielectric such as silicon dioxide ($SiO_2$) (not shown), and then contacted with a metal layer 208 (metal anode). The ZnO transparent and electrically conducting layer 204, serving as an upper waveguide cladding layer, is on a III-N upper injection layer 210 (e.g., p-GaN upper waveguide core), and therefore also on the laser core.

The active region 202 is between the upper injection layer 210 and a lower injection layer 212. The indium-containing III-Nitride active region 202 (e.g., InGaN-GaN MQW) is on the III-Nitride lower injection layer 212 (e.g., n-GaN lower waveguide core), wherein the III-Nitride lower injection layer 212 serves to inject electrons into the active region 202. The III-Nitride upper injection layer 210 on the active region 202 serves as an upper injection layer for carriers (e.g., holes) of a type (e.g. p-type) not provided by the lower injection layer 212. The laser core comprises the active region 202 on layer 212, and layer 210 on layer 202. The device's 200 layers may be grown, for example.

The effective refractive index of the laser core is higher than that of the lower cladding layer 214, and higher than that of the upper cladding layer 204, so that the laser core functions as a transverse optical waveguide core.

The upper injection layer 210, and therefore the laser core, is patterned in a plane of the layer 210, to form a rib or ridge 206, to serve as a lateral waveguide core.

Also shown are the n-AlGaN lower waveguide cladding 214, n-GaN substrate 216, and metal cathode 218.

Figure 3A:
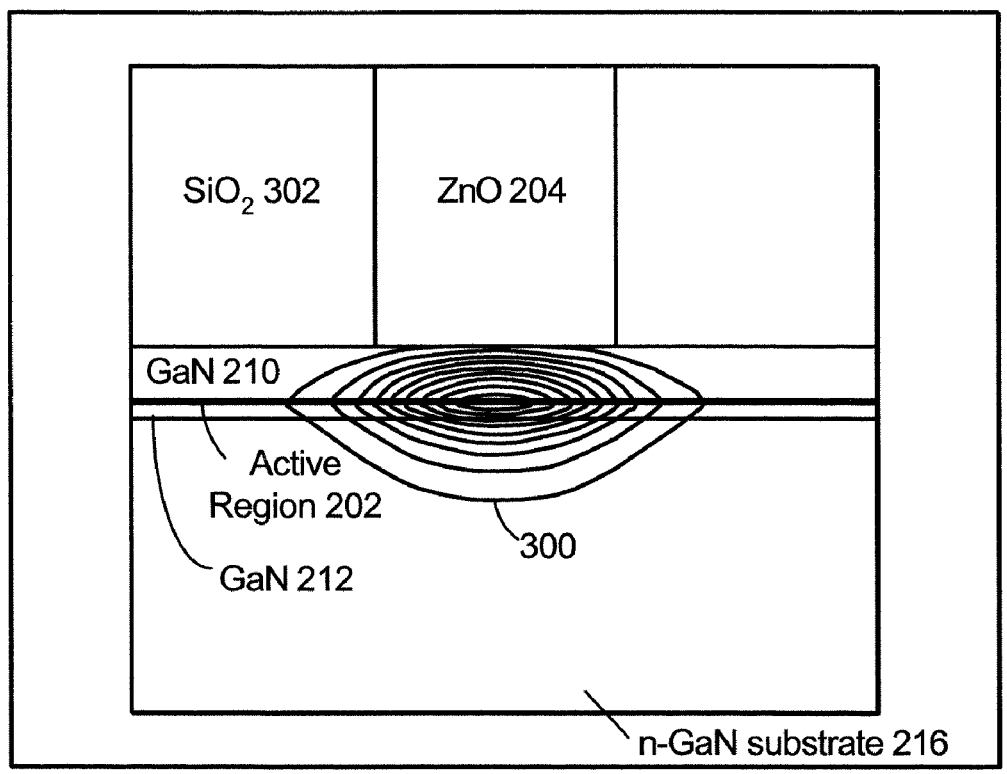
FIG. 3($a$) is a simulation of a fundamental optical mode profile in a ZnO-clad ridge waveguide laser.

ZnO has an index of refraction of approximately 2.0 in the green spectral region, appropriate for both transverse and lateral confinement of the optical mode 300 as simulated in FIG. 3(a), in which contours of equal optical intensity are shown for a single transverse optical mode. Also shown in FIG. 3(a) is the $SiO_2$ 302, p-GaN upper waveguide 210, active region 202, n-GaN lower waveguide 212, and n-GaN substrate 216. Optionally, as noted above, one or more III-N layers 210 may be patterned to form a shallow rib 206 to aid in lateral optical confinement. Single crystal ZnO has been shown to have low optical loss in the visible spectrum and low electrical resistance, able to make reasonably good electrical contact to p-type GaN, and that these properties may be obtained with ZnO grown on GaN from a low temperature aqueous bath [9].

Figure 3B:
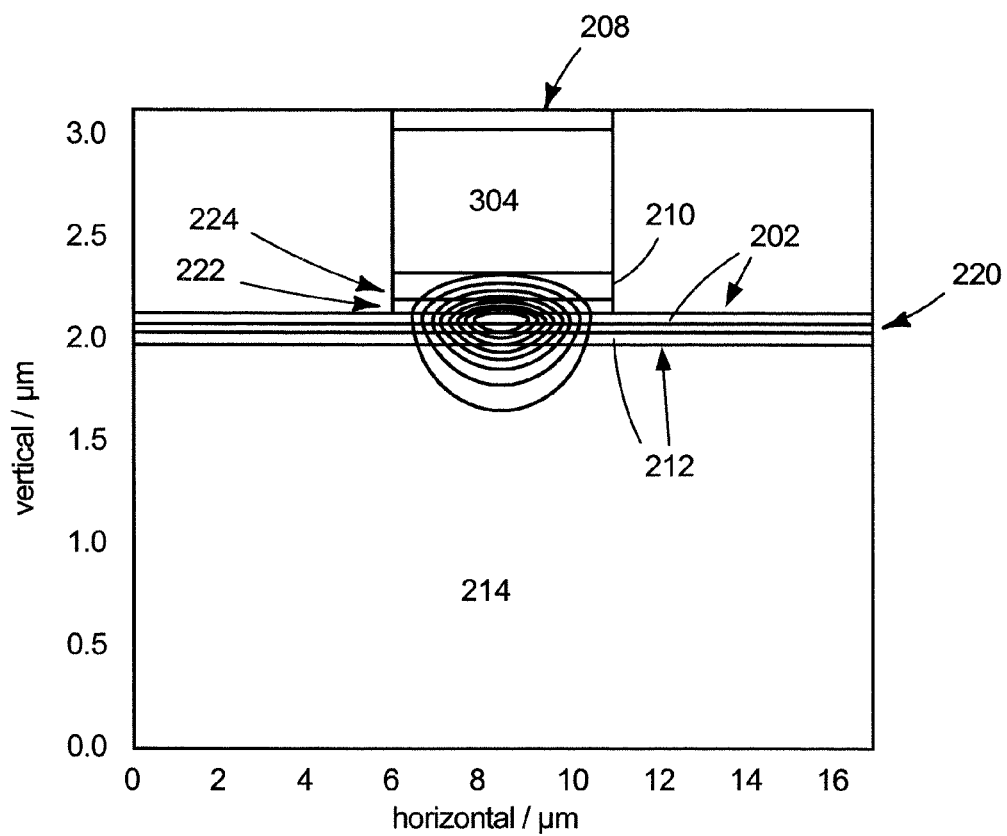

FIG. 3(b) is a schematic representation of an ITO 304 clad InGaN/GaN MQW 202 laser, having the structure of FIG. 2 (but using ITO 304 instead of ZnO 204). Also shown are lower and upper III-N separate confinement heterostructure layers 220 and 222, which further confine the optical mode to the laser core, upper blocking layer 224, and anode contact 208.

ZnO may be patterned by both wet and dry etching, or alternatively grown through a mask using an aqueous growth version of LEO [10]. The mask may be a dielectric such as $SiO_2$ and left in place after the LEO step, or it may be a soluble or etchable material such as photoresist and removed after the LEO step, leaving an air gap.

The AlGaN electron-blocking layer 110 shown in FIG. 1 is not universally used, and it has not been established that it is needed in green emitting diode lasers. It may prove advantageous to omit it. It has also been shown that when enough InGaN material is grown in the active region 108 or a separate confinement heterostructure, it is possible to eliminate the AlGaN cladding layer above 114 or below 104 the active region 108, or entirely [11]. In FIG. 2, both the electron-blocking layer 110 and the upper AlGaN cladding layer 114 have been omitted. The fundamental optical mode profile 300 in this device is shown in FIG. 3. The mode 300 is well confined in both transverse and lateral directions and provides a good overlap with the active region 202 for high modal gain. The high index contrast between GaN and ZnO, compared to GaN and AlGaN, leads to tighter confinement of the optical mode and reduced mode overlap with lossy p-type layers.

The second basic approach, based on wafer bonding and substrate removal, results in a device similar to the conventional device shown in FIG. 1. The fabrication process is shown schematically in FIGS. 4(a)-(e). Conventional crystal growth methods are used to grow part of the laser structure 400 through the active region 402 and stopping with a thin p-GaN layer 404, as shown in FIG. 4(a). For example, the structure 400 may comprise n-AlGaN lower cladding layer 406 on n-GaN substrate 408, n-GaN lower waveguide core 410 on the n-AlGaN lower cladding layer 406, InGaN-GaN active region 402 on the n-GaN lower waveguide core 410, and half of a p-GaN waveguide core 404 on the active region 402. On a second sacrificial substrate 412, as shown in FIG. 4(b), a p-GaN 414 (the other half of a p-GaN waveguide core) and optional p-AlGaN layer 416 (e.g., p-AlGaN electron blocking layer) are grown, along with a $p^+$-GaN contact layer 418, grown in reverse order to their position in the final device. A p-AlGaN upper cladding layer 420 and InGaN separation layer 422 may also be grown in the wafer 424. The two substrates 408 and 412 are then aligned (as shown in FIG. 4(c)), clamped together, and heated at a temperature adequate to cause bonding of the two wafers 400 and 424, but low enough to avoid degradation, likely in the range of 600-750° C. (as shown in FIG. 4(d)), thereby forming a wafer bond 426 between layers 404 and 414. After bonding, the sacrificial substrate 412 is removed by a combination of laser-assisted liftoff, physical polishing and chemical or photoelectrochemical etching, leaving a multilayer structure similar to the conventional single-growth structure, ready for completion by standard fabrication methods, as shown in FIG. 4(e). The p-GaN waveguide cores 404, 414 are bonded to form a single p-GaN waveguide core 428.

Thus, FIG. 4(e) illustrates an indium-containing III-N active region 402 grown on other III-N layers, including a III-N lower waveguide cladding layer 406, and a III-N lower waveguide layer 410, wherein the other III-N layers 406, 410 are grown on a first growth substrate 408, the active region 402 comprising (1) at least one indium-containing active layer 430 in which light is generated (e.g. InGaN quantum well); and (2) III-N confinement layers 432 (e.g., GaN barriers) adjacent to each side of the active layer, serving to confine carriers (electrons and holes) in the active layer 430; (b) an (Al,Ga,In)N contact layer 418 grown on a sacrificial substrate 412 and (Al,Ga,In)N separation layer 422; (c) an (Al,Ga,In)N upper waveguide cladding layer 420 and (Al,Ga,In)N, grown on the contact layer 418, acting as an upper waveguide cladding layer; and (d) a wafer bond between one half of the (Al,Ga,In)N upper waveguide core, layer 414, and the other half of upper waveguide core, layer 404, forming upper waveguide core layer 428 such that the lower waveguide core 410 layer and the upper waveguide core layer 428 bound the active region 402.

The position of the blocking layer 416 varies, and in such a wafer-bonded device it may also be on the wafer 400 with the active region 402.

It is generally found that superior electrical performance is obtained by bonding similarly-doped layers, either n-type to n-type or p-type to p-type, to avoid minority carrier loss due to defects at the bond interface. Thus, it would be necessary to grow at least a thin p-type III-N epitaxial layer 404 above the active region 402 in the implementation shown in FIGS. 4(a)-(e).

A possible variation of this approach is to use a commercially available bulk ZnO wafer instead of the (Al,Ga,In)N-sacrificial substrate combination: the ZnO may be bonded to the laser wafer at temperatures around 600° C., then mechanically or chemechanically thinned and polished to the desired thickness, followed by ridge formation and contact metal deposition [12]. It has been found that using a very thin metallic layer between the p-GaN and the ZnO improves the electrical contact, although the additional optical loss due to absorption in the metal must be considered.

In the third approach, the epitaxial upper waveguide 114 and contact layers 116 are replaced with an amorphous transparent conducting oxide such as evaporated or sputtered ITO. The optical absorption loss of amorphous ITO is 350-1000 $cm^{-1}$ at 500 nm, high compared to the 10 $cm^{-1}$ of single crystal ZnO, but still acceptable since the high index contrast between ITO and GaN results in a small optical overlap with the ITO. A variation utilizes a combination of crystalline and amorphous transparent conducting oxides, such as a layer of aqueous-grown ZnO, 100-200 nm thick, followed by a layer of evaporated or sputtered amorphous ITO. In this case, the benefits of crystalline ZnO are obtained while avoiding the difficulties in fabricating thicker crystalline ZnO layers.

Figure 5:
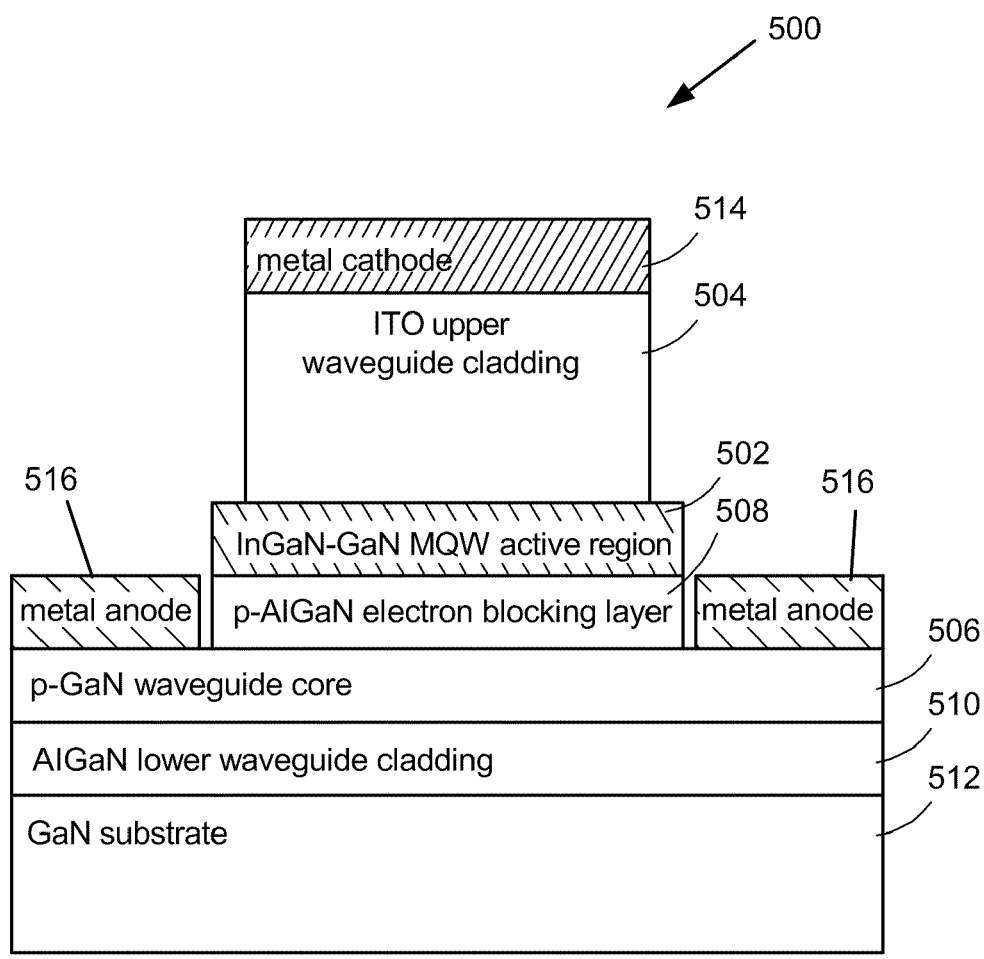
FIG. 5 is a schematic representation of a ridge waveguide laser using amorphous indium tin oxide (ITO) as the upper cladding and contact layer, wherein buffer layers and ridge dielectric isolation are not shown.

FIG. 5 is a cross-sectional schematic of an example of the third approach, an (Al,Ga,In)N based diode laser 500 comprising an (Al,Ga,In)N active region 502 for emitting light; and ITO as the at least one transparent and electrically conducting layer 504 deposited on the active region 502 to provide electrical contact to the active layer 502, wherein the transparent and electrically conducting layer has a refractive index lower than a refractive index of the active region 502. The indium-containing III-Nitride active region 502 (e.g., InGaN-GaN MQW) is grown on a III-Nitride lower injection layer 506 (e.g., p-GaN) wherein the lower injection layer 506 serves to inject holes into the active region 502. A p-AlGaN electron blocking layer 508 is between the active region 502 and the lower injection layer 506, the p-GaN 506 is on an AlGaN lower waveguide cladding layer 510, the waveguide cladding layer 510 is on a GaN substrate 512, a metal cathode 514 is on the ITO 504, and metal anodes 516 are on the p-GaN 506. The laser core comprises the active region 502, injection layer 506, and at least one first III-N blocking layer 508 (electron blocking layer). The layer 508 is between the active region 502 and the lower injection layer 506, and serves to prevent injection of first minority carriers into the lower injection layer 506, wherein the first minority carriers are carriers of the type not provided by the lower injection layer 506. In this case, the blocking layer 508 prevents injection of electrons into a hole injection layer 506.

Alternatively, or in addition, at least one second III-N blocking layer may be provided, between the active region and an upper injection layer, that serves to prevent injection of second minority carriers into the upper injection layer, wherein the second minority carriers are carriers of the type not provided by the upper injection layer. For example, the second III-N blocking layer may prevent injection of holes into the upper injection layer if the upper injection layer is an electron injection layer.

Ohmic contacts have been achieved to both p-type [13] and n-type [14] GaN. To take advantage of this, the GaN p-contact and hole injection layer 506 may be moved below the active region 502, along with the optional AlGaN electron blocking layer 508 as shown schematically in FIG. 5. This eliminates the need to grow p-GaN 112 and p-AlGaN 110 above the active layer 108, further reducing the likelihood of active region 108 degradation. It is generally found that the surface of p-GaN roughens as the thickness of the layer increases, which might interfere with good growth of a quantum well active region. For this reason, it is advantageous to keep the p-GaN layer as thin as needed for adequate current transport from the anode contact to the active region: a thickness of approximately 0.5 micron should provide adequate conductivity without significant roughening.

Which of these various approaches will be the most successful depends on a balance between electrical conductivity and optical loss, the extent to which each approach allows optimization and retention of the active region quality, and on fabrication and reliability issues. Based on the best demonstrated contact resistance between ITO and p-GaN and on the best measured optical transparency of ITO, and on the known fabrication technology and reliability of ITO contact to III-N light emitting devices, the preferred approach is that shown in FIG. 3(*b*), with a thin p-GaN hole injection and waveguide core layer 210 grown above the active region 202, followed by an ITO transparent and electrically conducting layer 304. The preferred fabrication technique for the ITO is by physical vapor deposition.

Alternative transparent conductive oxides include, but are not limited to, indium oxide, tin oxide, zinc oxide, gallium oxide, magnesium oxide, cadmium oxide, and various alloys of these compounds, all with a variety of doping variants. Generally, these materials may also be deposited by evaporation or sputtering techniques. Transparent conductors other than oxides also exist and may be useful: TiN/ITO contacts to p-GaN have been demonstrated [15]. The choice again depends on the balance between electrical conductivity and optical loss, and on fabrication and reliability issues. The transparent and electrically conducting layer typically have an optical absorption coefficient below 2000 $cm^{-1}$, measured at the laser wavelength, and a bulk resistivity below 10 Ohm-cm, and be capable of making an electrical contact to the laser core with a specific contact resistance below 0.01 Ohm-$cm^2$. However, other values for the bulk resistivity, specific contact resistance, and absorption coefficient are also possible.

Figure 6:
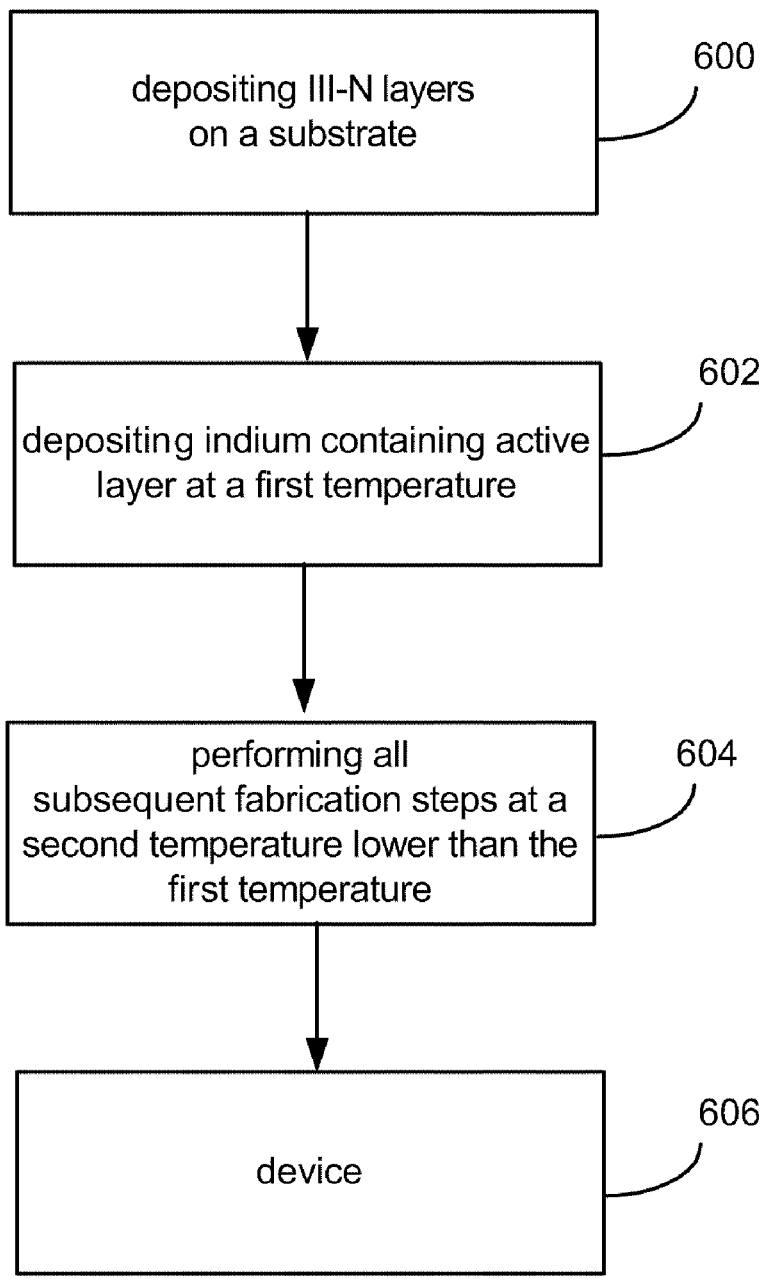
FIG. 6 is a flowchart illustrating a method of the present invention.

FIG. 6 illustrates a method of fabricating an (Al,Ga,In)N laser diode. The method comprises one or more of the following steps:

Block 600 represents depositing one or more III-N layers upon a growth substrate.

Block 602 represents depositing an indium containing active region. The indium containing active region layers may be deposited upon the III-N layers at a first temperature. The indium containing active layer typically has a first side and a second side. For example, an indium containing (Al,Ga,In)N active region may be deposited at a first temperature on one or more (Al,Ga,In)N first waveguide core or cladding layers, wherein a first waveguide core or cladding layer is grown on a device substrate and the device substrate is on the first side of the active region. The indium containing (Al,Ga,In)N active region may be deposited by MOCVD, however, other deposition methods may be used.

Block 604 represents performing subsequent fabrication steps. For example, all of the subsequent fabrication steps may be at a second temperature that is sufficiently or substantially lower than the first temperature of Block 602 (e.g., below 550° C.), to inhibit degradation of the active layer. The subsequent fabrication steps may include depositing subsequent layers on the second side of the active region, opposite the first side, at a second temperature that is lower than the first temperature at which the indium containing active region is deposited in Block 602, so that the active region is not degraded, wherein the subsequent layers comprise one or more of the following layers: at least one second waveguide core layer, at least one second waveguide cladding layer, at least one carrier injection layer, at least one carrier blocking layer, and at least one electrical contact layer.

Examples of the second waveguide cladding layer include, but are not limited to, (1) a crystalline transparent conductive oxide layer grown from an aqueous solution, (2) a combination of a crystalline transparent conductive oxide layer grown from an aqueous solution and an amorphous or polycrystalline transparent conducting oxide layer deposited by physical vapor deposition, (3) an amorphous or polycrystalline transparent conducting oxide formed by physical vapor deposition, or (4) a crystalline transparent conductive oxide layer wafer bonded to the laser core (e.g., to the active region or second waveguide core layer).

Block 606 represents the end result, a device.

Summary

To summarize, this invention describes several related designs and fabrication methods for (Al,Ga,In)N-based diode lasers intended primarily for operation at wavelengths between 495-570 nm. The advantages over other lasers that may operate in this spectral range include small size, low weight, low cost, high efficiency, high reliability, and the ability to modulate at high frequency. The expected performance improvements over the existing art should be dramatic, so that new classes of products and applications will be enabled. The primary innovations include:

Reduced exposure of the active region to conditions leading to degradation, in particular, reduced exposure to elevated temperature after the active region has been grown.

Termination of the high temperature epitaxial crystal growth before the conventional upper waveguide cladding and contact layers.

Improved optical mode confinement through use of materials with high refractive index contrast.

Use of ZnO grown from an aqueous bath onto GaN, as waveguide cladding and electrical contact layers.

Use of bulk-grown ZnO bonded onto GaN as laser waveguide and electrical contact layers.

Use of (Al,Ga,In)N layers, grown on a sacrificial substrate and transferred to an incomplete laser structure on another substrate, as waveguide cladding and electrical contact layers.

Use of amorphous or polycrystalline transparent conducting oxides as waveguide cladding and electrical contact layers.

Use of a p-type epitaxial layer or layers grown beneath the laser active region.

Figure 7:
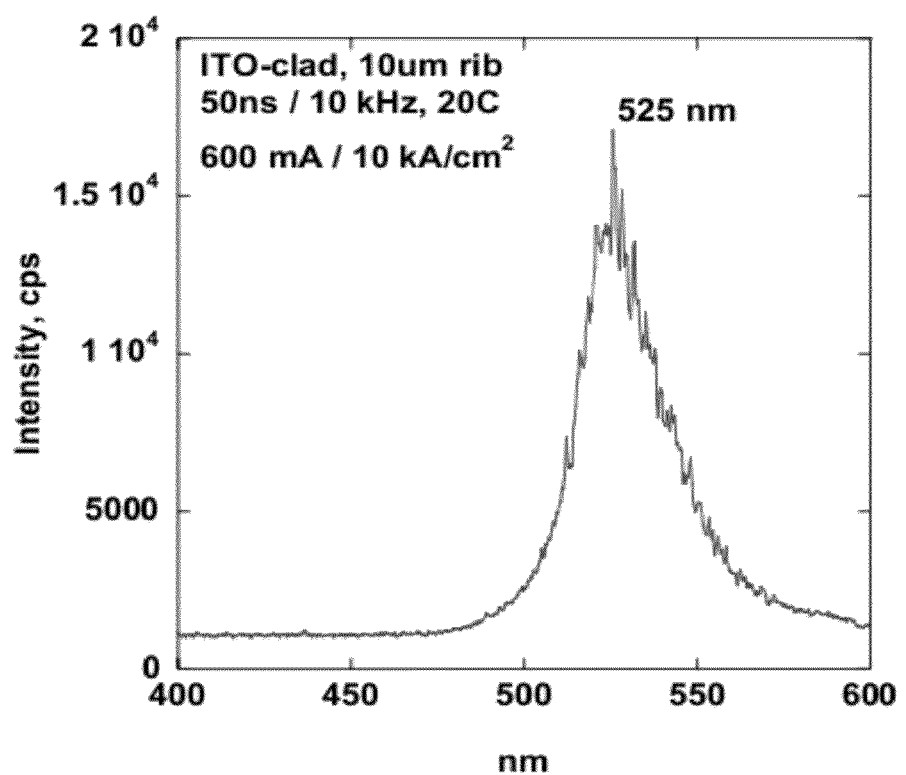
FIG. 7 shows the spectrum from an electrically pumped, ITO clad InGaN MQW laser, plotting intensity (counts per second, cps) as a function of wavelength of the light (nanometers, nm) wherein resonator modes rise above the spontaneous emission, indicating the device is near lasing threshold.

FIGS. 2, 3, 4(*a*)-(e), 5, and 6 illustrate embodiments of a laser diode that can emit green light having a wavelength longer than 515 nm, and FIG. 7 shows the spectrum of light emitted from a laser similar to the structure of FIG. 2, with an ITO upper waveguide cladding instead of ZnO. The indium composition of the indium containing III-nitride active region are such that the active layer emits the light having a wavelength longer than 515 nm (the indium composition controls the size of the active layer's bandgap, which in turn determines the wavelength of light that is emitted). For example, the indium composition can be at least 25% (e.g. the active layer can be $In_{0.25}Ga_{0.75}N$, for example). The indium composition and crystal quality are at least as high as compared to an indium composition and crystal quality of the active region prior to bonding or growth of (i.e., without) one or more laser cladding, laser waveguide, or contact layers on the active layer.

Possible Modifications and Variations

The present invention envisages the use of transparent conducting oxide waveguide cladding and contact layers integrated with the high temperature epitaxial growth, p-type electrical transport layers grown beneath laser active regions, wafer-bonded waveguide and electrical transport layers transferred onto the active regions, and laser designs must be optimized with regard to performance requirements.

Throughout the disclosure, a transparent conductor may be used instead of a transparent conducting oxide, to include materials that are neither oxides nor III-nitrides, such as TiN. The transparent and electrically conducting layer can be transparent to the light emitted by the active region, crystalline, or amorphous, for example. The transparent and electrically conducting layer is typically a waveguide cladding layer that aids confinement of the light generated in the active layer, thereby improving confinement of the light to the laser core.

The transparent and electrically conducting layer may be deposited by a variety of methods, for example, deposited or grown (typically by a method other than crystal growth at a temperature above 550° C.), or wafer bonded (so that the wafer bond is typically between the transparent and electrically conducting layer and the laser core). The wafer bond may be in different locations between the transparent and electrically conducting layer and the active region or the upper injection layer. For example, the transparent and electrically conducting layer may interface the active region or upper injection layer directly, or there may be one or more additional layers between the active region and the transparent and electrically conducting layer.

While the primary utility of this invention has been identified as lasers operating between 490-570 nm, some or all of the innovations described here will be of use for diode lasers operating at other wavelengths, and it is not implied that the scope of this invention is limited to any specific wavelength range. Many variations of these innovations exist and may be used in different combinations, and it is not implied that the scope of this invention is limited to the specific embodiments described here.

Advantages and Improvements

In general, diode lasers are significantly smaller, cheaper, and more efficient than any other type of laser, and may be easily modulated at high frequency. For example, miniature frequency doubled diode pumped solid state lasers are limited in power to approximately 100 milliwatts (mW), and reach only 17% wall plug efficiency, and are costly to manufacture due to the need to carefully align a diode pump laser and nonlinear crystal for frequency doubling. In comparison, a diode laser emitting directly in the blue or green range is expected to achieve 50% efficiency or better, provide optical power of hundreds of mW, and be simple to manufacture and package. For these reasons diode lasers have historically supplanted other laser types in many markets, once the diode lasers become available.

Currently, lasers emitting in the 485-570 nm spectral range include argon ion, helium neon, and frequency doubled solid state lasers. These lasers are used primarily for scientific research, biomedical screening and drug development, and material processing and are good candidates for replacement by diode lasers. More importantly, green emitting diode lasers could be combined with existing blue and red emitting diode lasers to enable mass-produced high quality full color projection displays for consumer use. Such a mass market is of interest to many manufacturers of electronic components and systems. The present invention could be used to manufacture diode lasers for incorporation into a variety of mass-produced consumer, industrial, medical, scientific, and military products.

Advantages over the current art include higher material gain and access to longer wavelength operation due to superior crystal quality, and higher modal gain due to higher refractive index contrast.

References

The following references are incorporated by reference herein:

[1] Sasaoka, C., Physica Status Solidi (a), 203: 1824-1828 (2006).
[2] Fang, A., Optics Express, 14: 9203-9210 (2006); see also Bowers, J. E., US Patent Application 20070170417.
[3] Sink, R. K., Applied Physics Letters, 68: 2147-2149 (1996); see also Bowers, J. E., U.S. Pat. No. 5,985,687.
[4] Murai, A., Applied Physics Letters, 89: 171116 (2006).
[5] Okuyama, H., IEICE Transactions on Electronics, E83C: 536-545 (2000).
[6] Nguyen, H K, IEEE Photonics Technology Letts., 18: 682-685 (2006).
[7] Miyoshi, T., Applied Physics Express, 2: 062201 (2009).
[8] Skierbiszcewski, C., Acta Physica Polonica A, 110: 345-351 (2006).
[9] Kim, J. H., Advanced Functional Materials, 17: 463-471 (2007).
[10] Andeen, D., Advanced Functional Materials, 16: 799-804 (2006).
[11] Feezell, D., Japanese Journal of Applied Physics, 13: L284-L286 (2007).
[12] Murai, A., Applied Physics Letters, 89: 171116 (2006).
[13] Yao, Y., Displays, 28: 129-132 (2007).
[14] Hwang, J. D., Microelectronic Engineering, 77: 71-75 (2005).
[15] Margalith, T., Proceedings of the SPIE, 3944 (1-2): 10-21 (2000).

Conclusion

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. An (Al,Ga,In)N based diode laser comprising:
 (a) a plurality of (Al,Ga,In)N layers, including an indium-containing active region, for generating and confining green light having a laser wavelength longer than 515 nm; and
 (b) at least one transparent and electrically conducting layer deposited on or above the indium-containing active region as a waveguide or cladding layer and to provide electrical contact to the indium-containing active region, wherein the transparent and electrically conducting layer comprises one or more oxide layers or bonded (Al,Ga,In)N layers, and the transparent and electrically conducting layer is deposited by a method other than crystal growth at a temperature above 550° C. to prevent degradation of the indium-containing active region.

2. The (Al,Ga,In)N based diode laser of claim 1, wherein the transparent and electrically conducting layer is amorphous.

3. The (Al,Ga,In)N based diode laser of claim 1, wherein the transparent and electrically conducting layer is crystalline.

4. The (Al,Ga,In)N based diode laser of claim 1, wherein the transparent and electrically conducting layer is Indium Tin Oxide (ITO).

5. The (Al,Ga,In)N based diode laser of claim 1, wherein the transparent and electrically conducting layer is Zinc Oxide (ZnO).

6. The (Al,Ga,In)N based diode laser of claim 1, wherein the transparent and electrically conducting layer is selected from a group comprising metal oxides including tin oxide, zinc oxide, gallium oxide, magnesium oxide, cadmium oxide, and alloys of these compounds.

7. The (Al,Ga,In)N based diode laser of claim 1, wherein the transparent and electrically conducting layer is a III-N material wafer bonded to the (Al,Ga,In)N layers.

8. The (Al,Ga,In)N based diode laser of claim 1, wherein the transparent and electrically conducting layer is a cladding layer that improves confinement of light to the (Al,Ga,In)N layers.

9. The (Al,Ga,In)N based diode laser of claim 1, wherein the transparent and electrically conducting layer is different from a III-Nitride material.

10. The (Al,Ga,In)N based diode laser of claim 1, wherein the transparent and electrically conducting layer is patterned in a plane of the transparent and electrically conducting layer to form a rib or ridge, to serve as a lateral waveguide.

11. The (Al,Ga,In)N based diode laser of claim 1, further comprising a wafer bond between the transparent and electrically conducting layer and the (Al,Ga,In)N layers.

12. The (Al,Ga,In)N based diode laser of claim 1 wherein the transparent and electrically conducting layer, serving as an upper cladding layer, is a growth on the (Al,Ga,In)N layers.

13. The (Al,Ga,In)N based diode laser of claim 12, wherein the (Al,Ga,In)N layers are fabricated on a lower cladding layer, the effective refractive index of the (Al,Ga,In)N layers is higher than that of the lower cladding layer, and higher than that of the upper cladding layer, so that the (Al,Ga,In)N layers function as a transverse optical waveguide.

14. The (Al,Ga,In)N based diode laser of claim 1, wherein the (Al,Ga,In)N layers is deposited on a transparent layer of lower refractive index, such that the transparent layer of lower refractive index serves as a transverse optical waveguide cladding layer.

15. The (Al,Ga,In)N based diode laser of claim 1, wherein the (Al,Ga,In)N layers is patterned in a plane of the (Al,Ga,In)N layers to form a rib or ridge, to serve as a lateral waveguide.

16. The (Al,Ga,In)N based diode laser of claim 1, wherein the (Al,Ga,In)N layers comprises:
(a) the active region grown on a III-Nitride lower injection layer, wherein the III-Nitride lower injection layer serves to inject either electrons or holes into the active region,
(b) the active region comprising:
(1) at least one indium-containing active layer in which the light is generated; and
(2) III-Nitride confinement layers adjacent to each side of the active layer, serving to confine the electrons and holes;
(c) at least one III-Nitride upper injection layer grown on the active region, serving as an upper injection layer for carriers of a type not provided by the lower injection layer; and
(d) at least one first III-Nitride blocking layer between the active region and the lower injection layer, or at least one second III-Nitride blocking layer between the active region and the upper injection layer, or the first III-Nitride blocking layer and the second III-Nitride blocking layer, wherein:
(i) the first III-Nitride blocking layer serves to prevent injection of first minority carriers into the lower injection layer and the first minority carriers are carriers of the type not provided by the lower injection layer, and
(ii) the second III-Nitride blocking layer serves to prevent injection of second minority carriers into the upper injection layer and the second minority carriers are carriers of a type not provided by the upper injection layer.

17. A method of fabricating an (Al,Ga,In)N based diode laser comprising:
fabricating a plurality of (Al,Ga,In)N layers, including an indium-containing active region, for generating and confining green light having a laser wavelength longer than 515 nm; and
depositing at least one transparent and electrically conducting layer on or above the indium-containing active region as a waveguide or cladding layer and to provide electrical contact to the indium-containing active region, wherein the transparent and electrically conducting layer comprises one or more oxide layers or bonded (Al,Ga,In)N layers, and the transparent and electrically conducting layer is deposited by a method other than crystal growth at a temperature greater than 550° C. to prevent degradation of the indium-containing active region.

18. The method of claim 17, wherein the indium-containing active region is fabricated by metal organic chemical vapor deposition (MOCVD).

19. The method of claim 17, wherein the transparent and electrically conducting layer is a crystalline transparent conductive oxide layer grown from an aqueous solution.

20. The method of claim 17, wherein the transparent and electrically conducting layer is a combination of a crystalline transparent conductive oxide layer grown from an aqueous solution and an amorphous or polycrystalline transparent conducting oxide layer deposited by physical vapor deposition.

21. The method of claim 17, wherein the transparent and electrically conducting layer is an amorphous or polycrystalline transparent conducting oxide formed by physical vapor deposition.

22. The method of claim 17, wherein the transparent and electrically conducting layer is a crystalline transparent conductive oxide layer wafer bonded to the (Al,Ga,In)N layers.

23. The method of claim 17, wherein the transparent and electrically conducting layer comprises (Al,Ga,In)N layers grown on a sacrificial substrate and wafer bonded to the (Al,Ga,In)N layers.

24. The (Al,Ga,In)N based diode laser of claim 1, wherein the transparent and electrically conducting layer has a refractive index lower than an effective refractive index of the indium-containing active region.

25. The (Al,Ga,In)N based diode laser of claim 1, wherein the transparent and electrically conducting layer has a bulk resistivity below 10 Ohm-cm and is capable of making an electrical contact to the (Al,In,Ga) laser with a specific contact resistance below 0.01 Ohm-cm$^2$.

26. The (Al,Ga,In)N based diode laser of claim 1, wherein the transparent and electrically conducting layer has an optical absorption coefficient below 2000 cm$^{-1}$ measured at the laser wavelength.

* * * * *